US009899933B2

(12) United States Patent
Nebel et al.

(10) Patent No.: US 9,899,933 B2
(45) Date of Patent: Feb. 20, 2018

(54) ELECTRICAL TRANSFORMER

(71) Applicant: Tibbar Plasma Technologies, Inc., Los Alamos, NM (US)

(72) Inventors: Richard A. Nebel, Los Alamos, NM (US); William L. Gibson, Los Alamos, NM (US); Keith Moser, Libertyville, IL (US)

(73) Assignee: TIBBAR PLASMA TECHNOLOGIES, INC., Los Alamos, NM (US)

( * ) Notice: Subject to any disclaimer, the term of this patent is extended or adjusted under 35 U.S.C. 154(b) by 30 days.

(21) Appl. No.: 15/209,907

(22) Filed: Jul. 14, 2016

(65) Prior Publication Data

US 2017/0027048 A1 Jan. 26, 2017

Related U.S. Application Data

(60) Provisional application No. 62/196,563, filed on Jul. 24, 2015.

(51) Int. Cl.
*G05F 3/06* (2006.01)
*H02M 7/02* (2006.01)
(Continued)

(52) U.S. Cl.
CPC ........... *H02M 7/02* (2013.01); *H01J 37/3266* (2013.01); *H01J 37/32697* (2013.01); *H02K 44/06* (2013.01); *H02M 7/40* (2013.01)

(58) Field of Classification Search
CPC ........ H02M 7/02; H02M 7/40; H01J 37/3266; H01J 37/32697; H02K 44/06
(Continued)

(56) References Cited

U.S. PATENT DOCUMENTS 5,680,014 A 10/1997 Miyamoto et al.
5,917,286 A 6/1999 Scholl et al.
(Continued)

FOREIGN PATENT DOCUMENTS

WO 2006025626 A1 3/2006
WO 2008140928 A1 11/2008
WO 2014084963 A1 6/2014

OTHER PUBLICATIONS

Aydemir, A.Y. et al., "Compressibility as a feature of field reversal maintenance in the reversed-field pinch," Physics of Fluids, Mar. 1985, pp. 898-902, vol. 28, No. 3, AIP Publishing, USA.
(Continued)

*Primary Examiner* — Carlos Amaya
(74) *Attorney, Agent, or Firm* — Rod D. Baker

(57) ABSTRACT

An apparatus and corresponding systems and methods for managing electric power, particularly a transformer system and method. An example apparatus includes a chamber configured to contain plasma. The apparatus includes at least two input electrodes disposed at least partially within the chamber, and configured to receive an alternating current into the chamber. The input electrodes are configured to direct the alternating current to induce motion in the plasma. The apparatus also includes at least two output electrodes extending from the chamber. The output electrodes are configured to conduct a direct current, from the induced motion in the plasma, for delivery from the chamber.

20 Claims, 15 Drawing Sheets

(51) Int. Cl.
*H02M 7/40* (2006.01)
*H01J 37/32* (2006.01)
*H02K 44/06* (2006.01)

(58) Field of Classification Search
USPC .......................................................... 307/151
See application file for complete search history.

(56) References Cited

U.S. PATENT DOCUMENTS

| | | | |
|---|---|---|---|
| 6,095,084 | A | 8/2000 | Shamouilian et al. |
| 6,215,678 | B1 | 4/2001 | Titus et al. |
| 6,396,213 | B1 | 5/2002 | Koloc |
| 6,781,087 | B1 | 8/2004 | Chism, Jr. et al. |
| 7,411,353 | B1 | 8/2008 | Rutberg et al. |
| 7,511,246 | B2 | 3/2009 | Morrisoe |
| 7,741,577 | B2 | 6/2010 | Kong et al. |
| 2004/0095705 | A1* | 5/2004 | Mills ........................ G21D 7/00 361/230 |
| 2004/0144314 | A1 | 7/2004 | David et al. |
| 2010/0068887 | A1 | 3/2010 | Harrington |
| 2011/0315867 | A1 | 12/2011 | Lane |

OTHER PUBLICATIONS

Schnack, D. C. et al., "Numerical simulation of reversed-field pinch dynamics," Computer Physics Comm., 1986, pp. 17-28, vol. 43, Amsterdam.

* cited by examiner

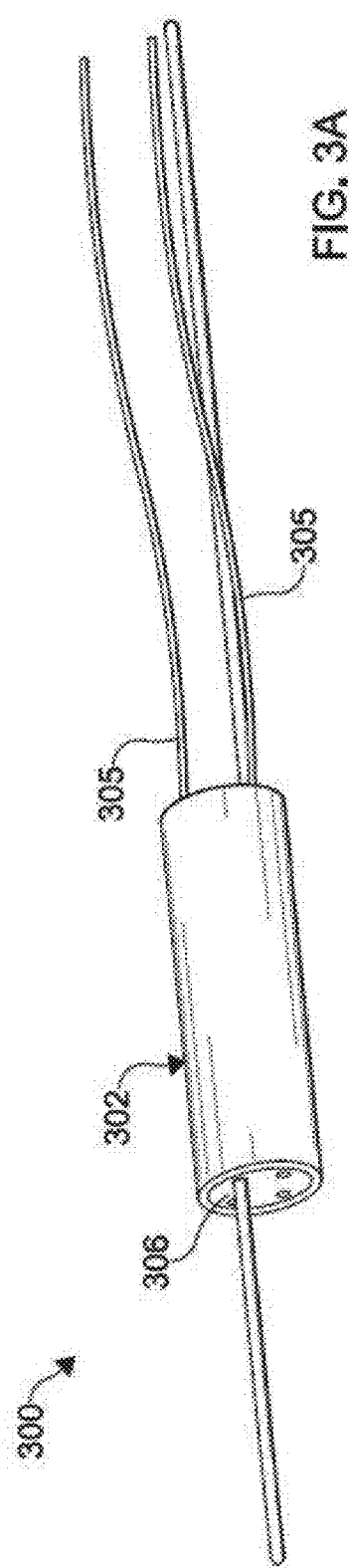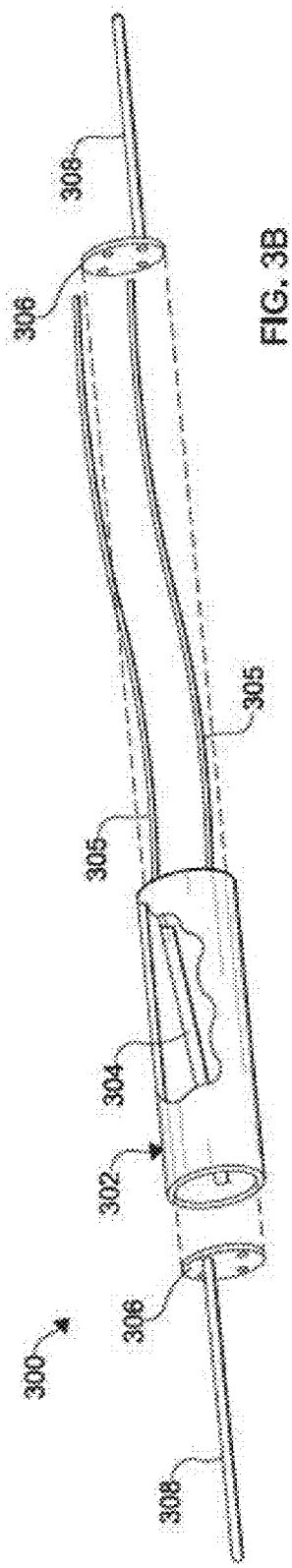

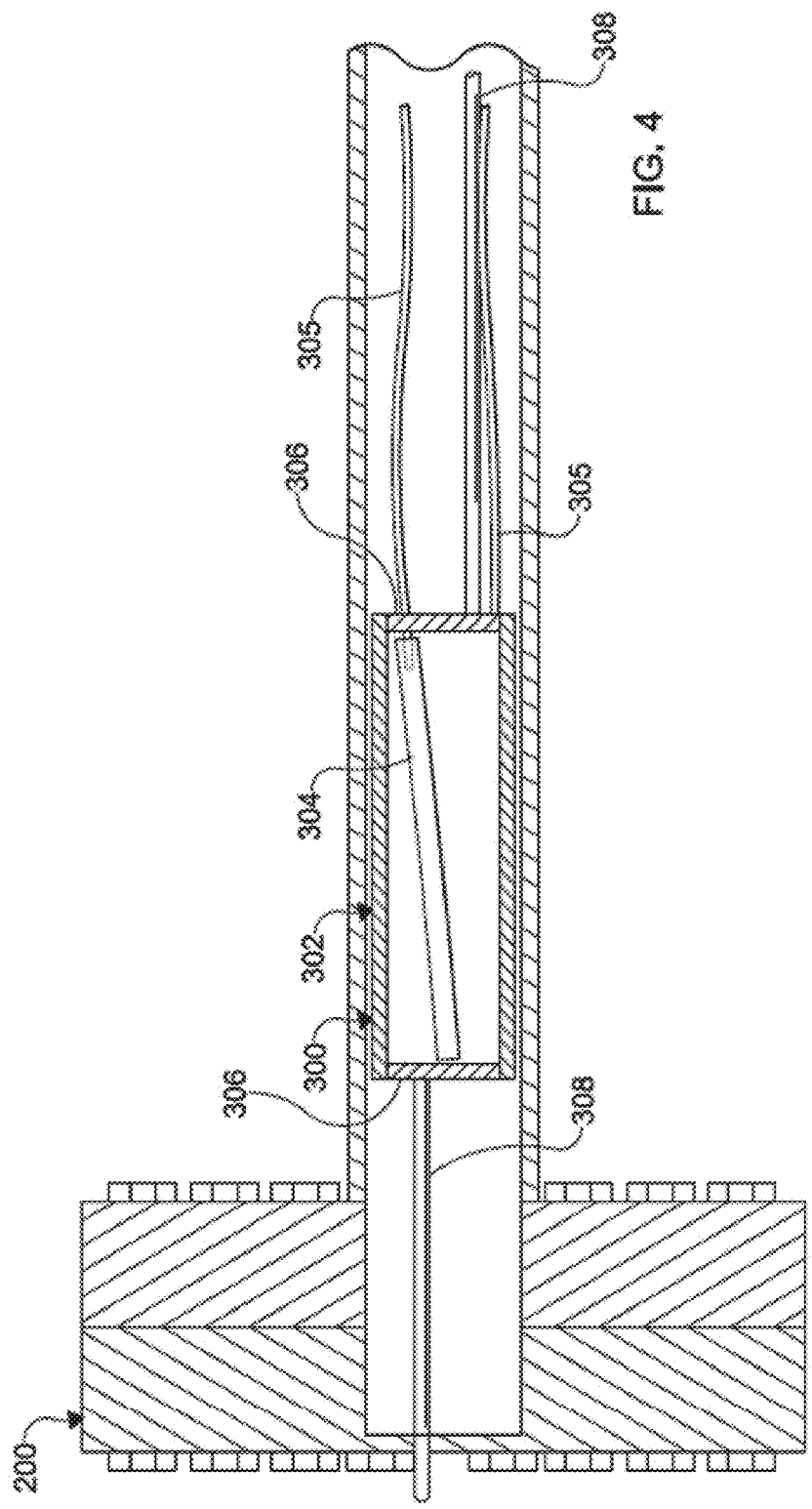

ELECTRICAL TRANSFORMER

CROSS REFERENCE TO RELATED APPLICATIONS

This application claims the benefit of U.S. Provisional Patent Application Ser. No. 62/196,563 entitled "Electrical Transformer," filed on 24 Jul. 2015, the entire disclosure of which is hereby incorporated by reference.

BACKGROUND OF THE INVENTION

Alternating current (AC) is typically preferred over direct current (DC) for transmission of electricity over long distances due, at least in part, to the ease of switching (i.e., stepping) voltages and currents with AC power using transformers. Such AC transformers enable long distance transmission. Transmission of DC over the same distances is not easy to do with DC power. Although current solutions provide long distance DC transmission, such solutions are complex and costly. These and other shortcomings are addressed by the present disclosure.

SUMMARY OF THE INVENTIVE DISCLOSURE

It is to be understood that both the following summary and the following detailed description are exemplary and explanatory only and are not restrictive. Provided are methods and systems for, in one aspect, managing AC and DC power. Provided are methods and systems for, in another aspect, transforming AC and DC power.

In an aspect, systems and methods of the present disclosure transform AC and DC voltages and currents, while minimizing cost and complexity. In another aspect, instead of using wires and iron cores similar to known AC transformers, the AC-DC transformer systems of the present disclosure can comprise plasma, helical electrodes, and an axial magnetic field. As an example, the transformation of the AC and DC voltages and currents can be based on magnetohydrodynamics (MHD) dynamo behavior.

In another aspect, an example system can comprise plasma disposed in a housing and two or more helical electrodes disposed in the housing, wherein an electric current passing through the two or more helical electrodes induces a rotation in the plasma.

In another aspect, an example system can comprise plasma disposed in a housing and two or more helical electrodes disposed in the housing, wherein an electric current passing through the two or more helical electrodes induces a rotation in the plasma. A conductive end cap can be coupled to the housing and the helical electrodes.

In yet another aspect, a method can comprise generating a magnetic field through plasma and generating a rotation in the plasma, thereby generating an electric current.

In another aspect, an example apparatus can comprise a chamber configured to contain plasma. The apparatus can comprise at least two input electrodes disposed at least partially within the chamber and configured to receive an alternating current into the chamber. The at least two input electrodes can be configured to direct the alternating current to induce motion in the plasma. The apparatus can comprise at least two output electrodes extending from the chamber. The at least two output electrodes can be configured to conduct a direct current from the chamber based on the induced motion in the plasma.

In another aspect, an example method can comprise conveying an alternating current into a chamber, inducing motion in a plasma contained in the chamber based on the alternating current, and receiving a direct current from the chamber based on the induced motion of the plasma.

In another aspect, an example system can comprise a transformer configured to transform an alternating current to a direct current. The transformer can comprise a chamber configured to contain plasma and at least two (e.g., two or more) input electrodes disposed at least partially within the chamber and configured to direct the alternating current to induce motion in the plasma thereby generating the direct current. The transformer can comprise at least two output electrodes extending from the chamber and configured to conduct the direct current from the chamber. The system can comprise an electrical delivery network electrically coupled to the at least two output electrodes and configured to conduct the direct current to at least one remote location.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3A is a perspective view of an exemplary transformer assembly;

FIG. 3B is an exploded perspective view of an exemplary transformer assembly;

FIG. 4 is a cross-section view of an exemplary transformer system;

Figure 1A:
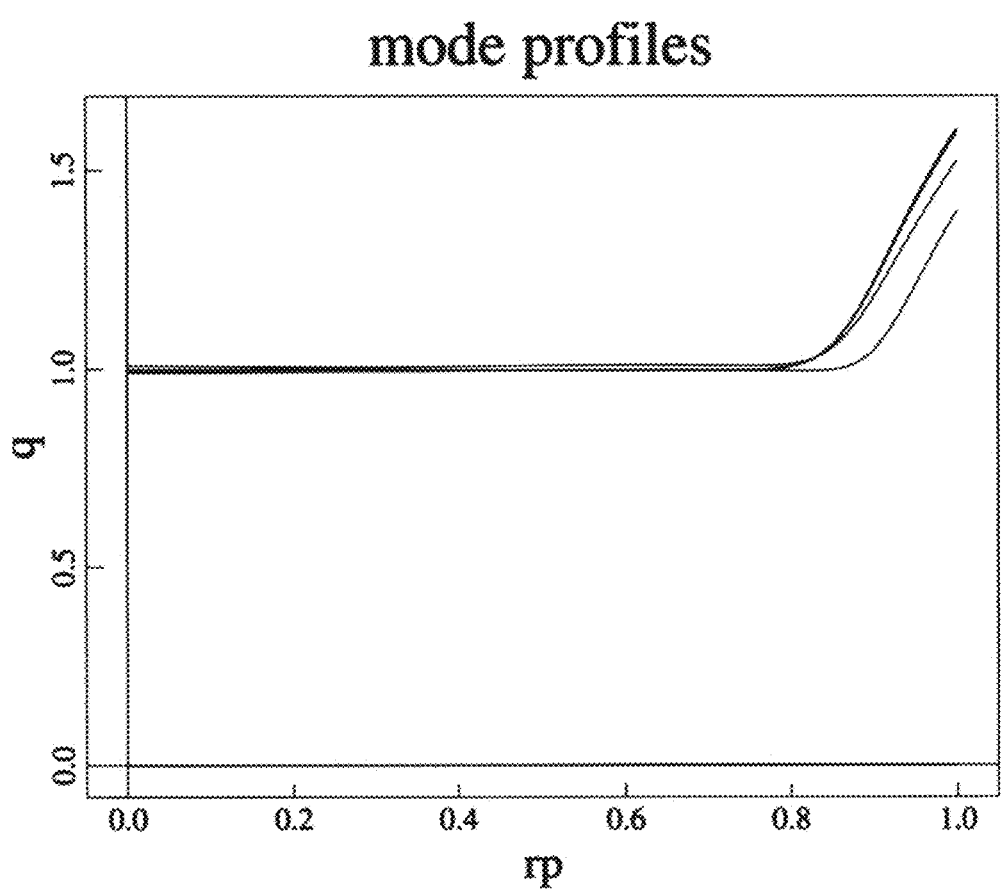
FIG. 1A is an example plot.

The various views are not necessarily to scale, either within a particular view or between views.

DETAILED DESCRIPTION OF EMBODIMENTS

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Herein disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this disclosure including, but not limited to, steps in disclosed methods. Thus, if there are a variety of additional steps that can be performed, it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following descriptions.

As will be appreciated by one skilled in the art, the methods and systems disclosed herein, and sub-methods and subsystems, may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software routines and algorithms. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It is understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

The computer program instructions according to this disclosure may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus, to produce a computer-implemented process such that the instructions that are executed on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and methods, and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

The systems and methods of the present disclosure generally involve inducing a flow in plasma. Flows can be induced in plasmas by applying an electric field perpendicular to the magnetic field. The ideal MHD Ohm's law can be written as:

$$E + v \times B = 0, \quad (1)$$

where E is the local electric field, v is the local plasma velocity, and B is the local magnetic field. Bold face indicates quantities which are vectors.

If equation (1) is crossed with the magnetic field B, it can be determined that the plasma flow perpendicular to the magnetic field (denoted as $V_{E \times B}$ and commonly referred to as the E×B drift velocity) becomes:

$$V_{E \times B} = (E \times B)/B^2, \quad (2)$$

where $B^2$ is the vector dot product of B with itself.

In order for the E×B drift velocity to significantly change the magnetic field it must be comparable to the Alfven speed ($V_A$) which can be expressed as:

$$V_A = B/(\mu_0 \rho)^{1/2}, \quad (3)$$

where B is the magnitude of the magnetic field, ρ is the mass per unit volume, and μ0 is the permittivity of free space. Equation (1) can be combined with Maxwell's field evolution equation:

$$\delta B/\delta t = -\text{curl}(E) \quad (4)$$

and integrated over a surface. As such, the result calculation provides that the magnetic field lines (or the magnetic flux) are substantially frozen into the plasma. As an example, the magnetic field lines convect with the plasma.

When plasma velocities approach the Alfven speed ($V_A$) the plasma velocities can bend the magnetic field lines. Thus, if a velocity shear is induced in the perpendicular velocity (e.g., the $V_{E \times B}$ drift velocity) along a magnetic field line, the magnetic field can be significantly modified (provided that the flow speeds are near the Alfven speed ($V_A$).

Three-dimensional nonlinear plasma simulations (resistive magnetohydrodynamics (MHD)) can be used to confirm aspects of the phenomenon described herein above. As an example, simulation code similar to that implemented in A. Y. Aydemir, D. C. Barnes, E. J. Caramana, A. A. Mirin, R. A. Nebel, D. D. Schnack, A. G. Sgro, *Phys Fluids* 28, 898 (1985) and D. D. Schnack, D. C. Barnes, Z. Mikic, D. S. Harned, E. J. Caramana, R. A. Nebel, *Computer Phys Comm* 43, 17 (1986), can be used. As a further example, plasma can be simulated in cylindrical geometry.

In an aspect, an axial magnetic field can be applied along a helical electric field (e.g., provided via a pair of helical electrodes on the boundary). Such simulation can be plotted as profiles, as shown in FIG. 1A.

The q value that is plotted is defined as:

$$q = 2\pi r_p B_\theta / (L B_z), \qquad (5)$$

where $r_p$ is the radial dimension of the cylinder, L is the Length of the cylinder, $B_\theta$ is the poloidal (or azimuthal) magnetic field, and $B_z$ is the axial magnetic field.

As illustrated in FIG. 1A, the initial conditions indicate no poloidal magnetic field and the axial magnetic field is constant everywhere (i.e., vacuum field conditions). The boundary conditions are that the electrodes undergo a single poloidal revolution as the axial coordinate goes from 0 to L.

As illustrated in FIG. 1A, the q=1 state corresponds to the magnetic field aligning itself parallel to the helical electrodes. As an example, q~1 everywhere in the plasma means that all of the magnetic field lines have almost the same helix, which allows them to slip through one another. However, the fact that q is finite means that the helical electrodes are driving an axial current. Large voltage and small current from the electrodes results in a large current with a small voltage parallel to the magnetic field. Such a simulation reflects a voltage step-down transformer.

Figure 1B:
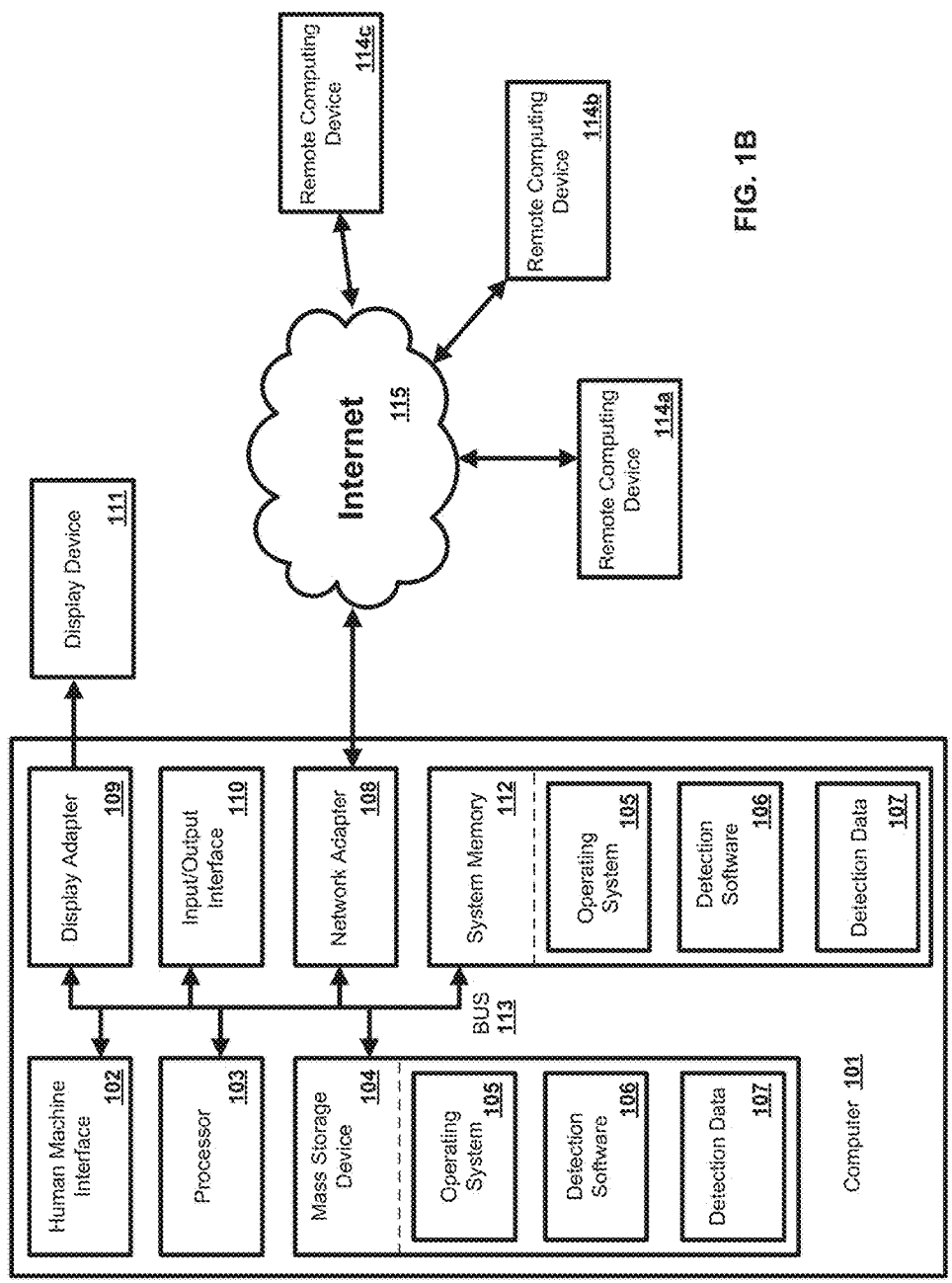
FIG. 1B is a block diagram of an exemplary computing device.

FIG. 1B is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, dynamos, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc., that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

With attention invited to FIG. 1B, one skilled in the art will appreciate that the systems and methods disclosed herein can be implemented via a general-purpose computing device in the form of a computer 101. The components of the computer 101 can comprise, but are not limited to, one or more processors or processing units 103, a system memory 112, and a system bus 113 that couples various system components including the processor 103 to the system memory 112. In the case of multiple processing units 103, the system can utilize parallel computing.

The system bus 113 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 113, and all buses specified in this description can also be implemented over a wired or wireless network connection and each of the subsystems, including the processor 103, a mass storage device 104, an operating system 105, simulation software 106, simulation data 107, a network adapter 108, system memory 112, an Input/Output Interface 110, a display adapter 109, a display device 111, and a human machine interface 102, can be contained within one or more remote computing devices 114a,b,c at physically separate locations, connected through buses of this form, in effect implementing a fully distributed system.

The computer 101 typically comprises a variety of computer readable media. Exemplary readable media can be any available media that is accessible by the computer 101 and comprises, for example and not meant to be limiting, both volatile and non-volatile media, removable and non-removable media. The system memory 112 comprises computer readable media in the form of volatile memory, such as random access memory (RAM), and/or non-volatile memory, such as read only memory (ROM). The system memory 112 typically contains data such as simulation data 107 and/or program modules such as operating system 105 and simulation software 106 that are immediately accessible to and/or are presently operated on by the processing unit 103.

The computer 101 may also comprise other removable/non-removable, volatile/non-volatile computer storage media. By way of example, FIG. 1B illustrates a mass storage device 104 which can provide non-volatile storage of computer code, computer readable instructions, data structures, program modules, and other data for the computer 101. For example and not meant to be limiting, a mass storage device 104 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 104, including by way of example, an operating system 105 and simulation software 106. Each of the operating system 105 and simulation software 106 (or some combination thereof) can comprise elements of the programming and the simulation software 106. Simulation data 107 can also be stored on the mass storage device 104. Simulation data 107 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

A user can enter commands and information into the computer 101 via an input device (not shown). Examples of known such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 103 via a human machine interface 102 that is coupled to the system bus 113, but can be connected by other interface and bus structures, such as a parallel port, game port, an IEEE 1394 Port (also known as a Firewire port), a serial port, or a universal serial bus (USB).

A display device 111 can also be connected to the system bus 113 via an interface, such as a display adapter 109. It is contemplated that the computer 101 can have more than one display adapter 109 and the computer 101 can have more than one display device 111. For example, a display device can be a monitor, an LCD (Liquid Crystal Display), or a projector. In addition to the display device 111, other output peripheral devices can comprise components such as speakers (not shown) and a printer (not shown) which can be connected to the computer 101 via Input/Output Interface 110. Any step and/or result of the methods can be output in any form to an output device. Such output can be any form of visual representation, including, but not limited to, textual, graphical, animation, audio, tactile, and the like.

The computer 101 can operate in a networked environment using logical connections to one or more remote computing devices 114a,b,c. By way of example, a remote computing device can be a personal computer, portable computer, a server, a router, a network computer, a peer device or other common network node, and so on. Logical connections between the computer 101 and a remote computing device 114a,b,c can be made via a local area network (LAN) and a general wide area network (WAN). Such network connections can be through a network adapter 108. A network adapter 108 can be implemented in both wired and wireless environments. Such networking environments are conventional and commonplace in offices, enterprise-wide computer networks, intranets, and the Internet 115.

For purposes of illustration, application programs and other executable program components such as the operating system 105 are illustrated herein as discrete blocks, although it is recognized that such programs and components reside at various times in different storage components of the computing device 101, and are executed by the data processor(s) of the computer. An implementation of simulation software 106 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Figure 2:
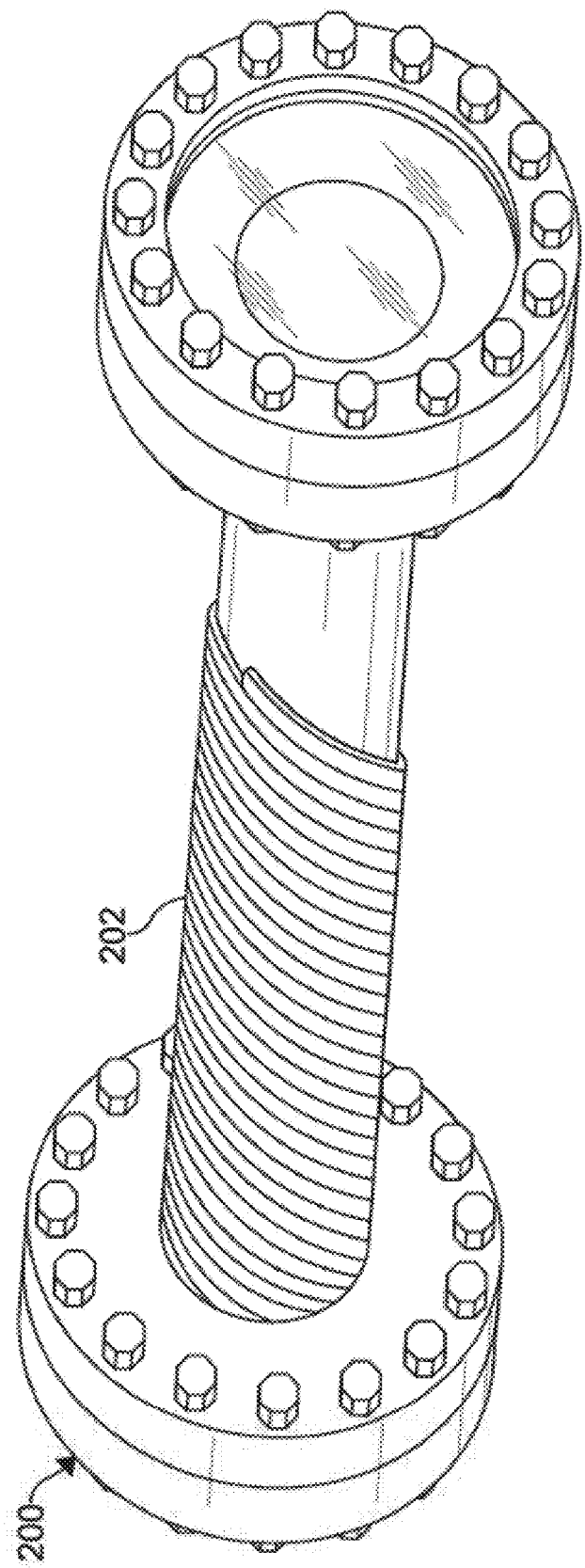
FIG. 2 is a perspective view of an exemplary transformer system according to the present invention.

FIG. 2 illustrates a cylindrical vacuum chamber 200 of a transformer system according to the present disclosure. Plasma (not shown) can be disposed in the chamber 200. As an example, a conductor 202 (e.g., wire) can be disposed around a periphery of the housing forming the chamber 200. As a further example, wire can be wound about the chamber 200 to define a solenoid that provides an axial magnetic field when current flows through the conductor.

FIG. 3A and FIG. 3B illustrate a transformer assembly 300. The transformer assembly comprises a housing 302 having one or more electrodes 304 (e.g., two or more electrodes) disposed therein and/or extending therefrom. As an example, the electrodes 304 can be disposed in the chamber 200 of FIG. 2. As shown, the electrodes 304 are helically wound and preferably have a 10:1 twist (e.g., the electrodes travel 10 times as far in the axial direction as they do in the poloidal (azimuthal direction)). Other twists can be used and ratios can be used. For example, twists can range from about 1:50 to about 1:1 axial to poloidal ratio. The electrodes 304 serve as the primary for the transformer system according to this disclosure. High voltage and low current can be is applied across the electrodes 304, for example, via leads 305. Accordingly, the applied electric field is perpendicular to the applied magnetic field from conductor 202.

The electrodes 304 thus induce rotation in the plasma via the E×B drift. Because the electrodes 304 are helical, this rotation is sheared in the axial direction. The result is that the field lines are bent and an axial current is induced.

The housing 302 can be formed from ceramic or electrical insulators such as plastic or composite materials. Moreover, end caps 306 preferably are disposed at opposite ends of the housing 302. In an aspect, the end caps 306 form the secondary of the transformer. The end caps 306 preferably are conductive and are capable of capturing the low voltage and high current that is generated parallel to the magnetic field.

Reference is made to FIG. 4, which illustrates a transformer system comprising one or more components as illustrated in FIG. 2 and FIGS. 3A-3B. More specifically, the transformer assembly 300 of FIGS. 3A-3B may in a preferred embodiment be disposed in the vacuum chamber 200 of FIG. 2. In another aspect, the helical electrodes 304 are powered by an electric current. A conductor carries the current from the end caps 306 and constitutes the secondary of the transformer. One or more terminals 308 can be coupled to the end caps 306 to allow the secondary current to be transmitted.

Figure 5:
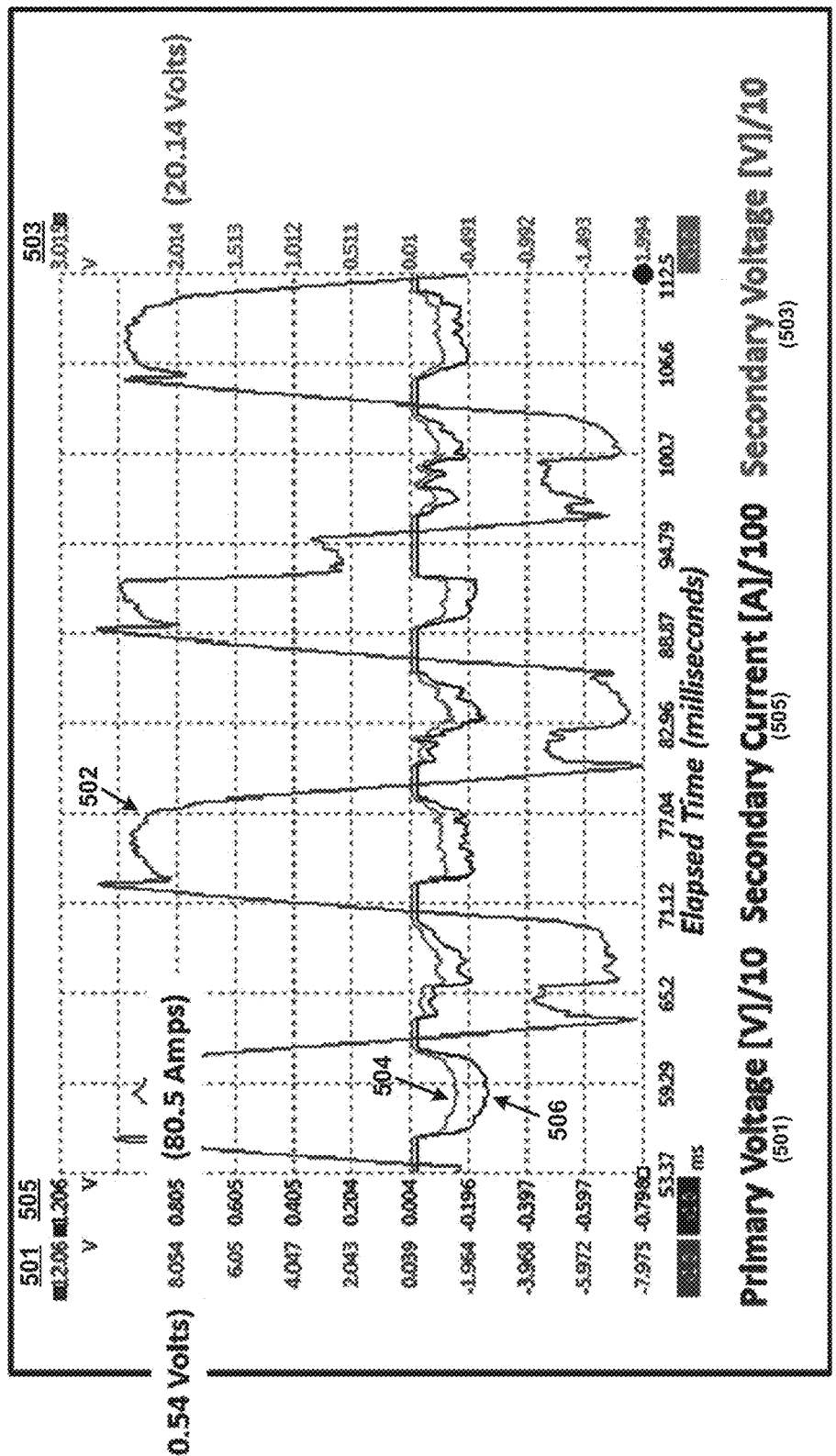
FIG. 5 illustrates oscilloscope traces demonstrating an AC-DC voltage stepdown transformer.

FIG. 5 is a graph illustrating oscilloscope curves that demonstrate the AC-DC transformer performance of the transformer system and apparatus according to the present disclosure. This graph illustrates an AC primary input being converted to DC in a secondary output. As shown, the first curve 502 represents the input voltage on the primary side of the transformer system (e.g., AC-DC converter). The input voltage is about 70 Volts and the first curve 502 reads as 7 Volts along a first scale 501. The second curve 504 represents an induced voltage on a secondary side of the transformer system. The induced voltage is about 3V which corresponds to 300 mV along a second scale 503. The third curve 506 represents a current in the secondary side of the transformer system. The current in the secondary is about 20 A which corresponds to 200 mV along a third scale 505. As illustrated, the voltage and the current in the secondary side proceed in the same direction even though the primary voltage changes sign over each half cycle. This graph shows the AC primary input has been converted to DC in the secondary output.

Figure 6:
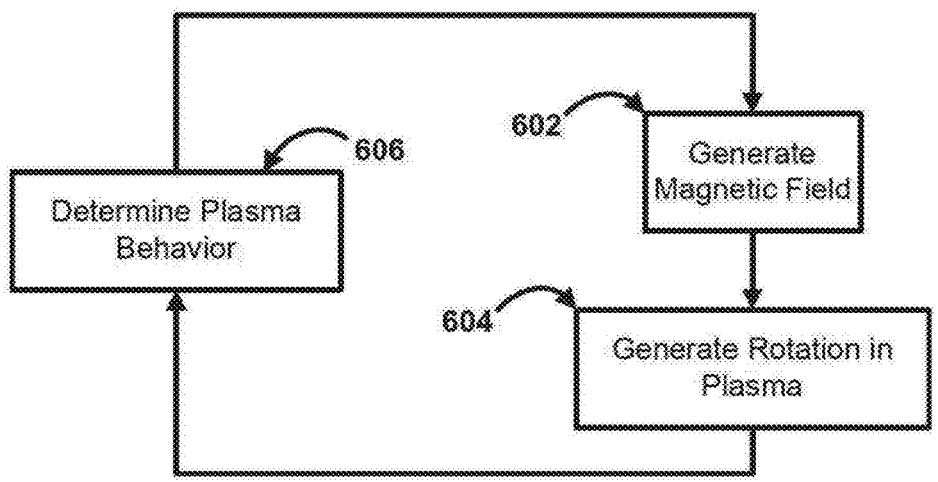
FIG. 6 is a flow diagram of an exemplary method.

The flowchart of FIG. 6 illustrates that a method according to this disclosure can comprise generating a magnetic field through a plasma (step 602) and generating a rotation in the plasma (step 604), thereby generating an electric current. The magnetic field can be generated by a solenoid assembly. As an example, the solenoid assembly can be disposed around the plasma, such as a solenoid housing. In an aspect, the rotation can be sheared in an axial direction relative to the plasma, and the current is generated in the axial direction. A drift speed of the plasma is a factor (e.g., fraction or multiple) of the Alfven Speed. For example, the drift speed of the plasma can be between about 0.01 and about 400 times the Alfven speed. As a further example, the drift speed can be between about 0.01 and about 2 times the Alfven speed, between about 0.01 and about 10 times the Alfven speed, between about 0.01 and about 100 times the Alfven speed, between about 0.01 and about 200 times, or between about 0.01 and about 300 times the Alfven speed. Other ranges of factors can result from the systems and methods of the present disclosure. In another aspect, generating a rotation in the plasma comprises generating one or more of a partial laminar flow and a turbulent flow in the plasma. In a further aspect, plasma behavior can be determined (e.g., estimated, simulated) using an MHD simulation (step 606). Accordingly, the magnetic field and rotation generated can be configured based on the MHD simulation.

Figure 7:
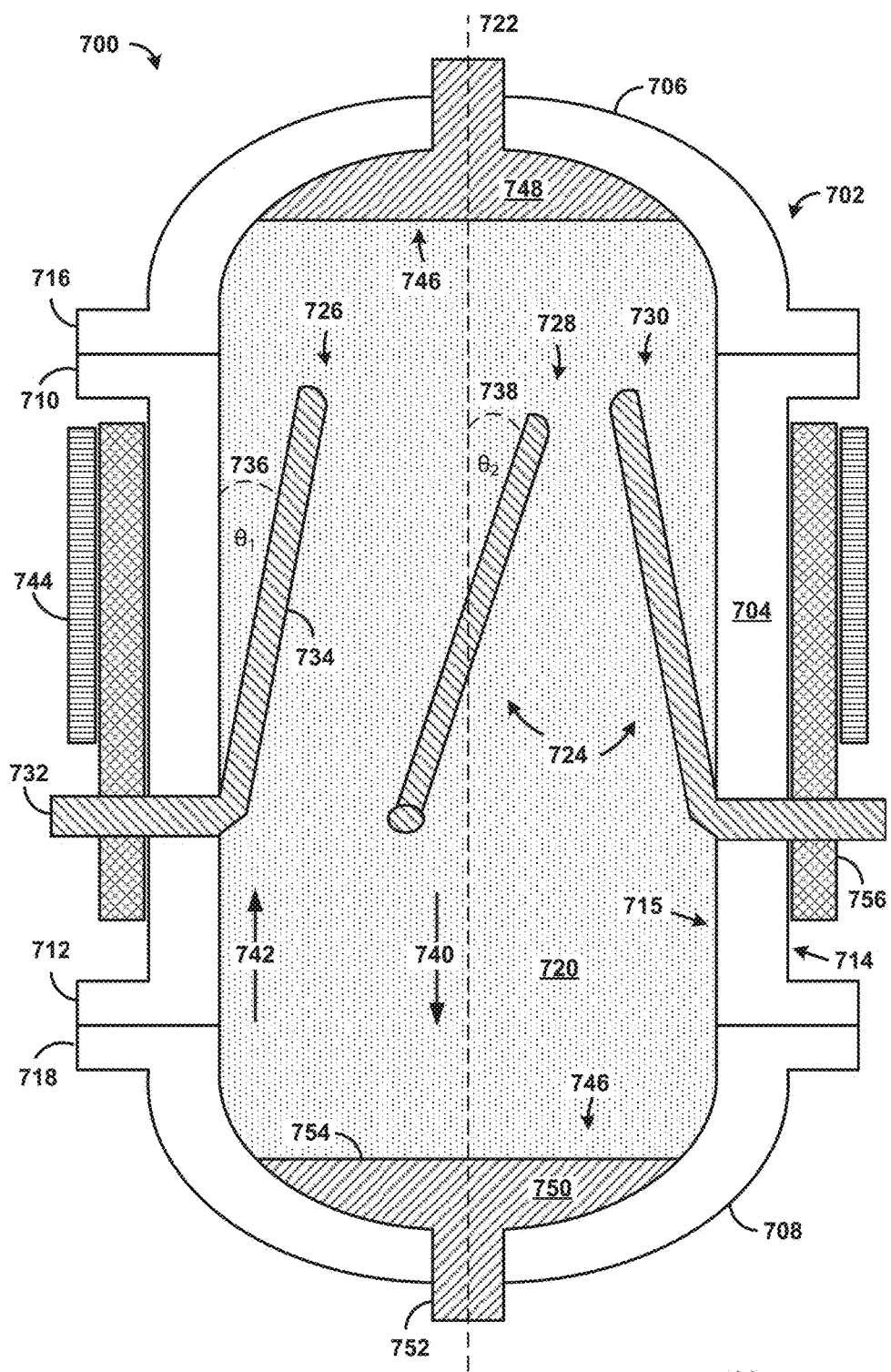
FIG. 7 is a diagram illustrating an example apparatus for transforming electrical current.

FIG. 7 is a diagram illustrating an example apparatus 700 for transforming and/or converting voltage and/or electrical current. The apparatus 700 can comprise a transformer, converter, and/or the like. For example, the apparatus 700 can be configured to convert a first current to a second current. The apparatus 700 can be configured to convert a first voltage (e.g., accompanying the first current) to a second voltage. The second voltage can be a high voltage or low voltage in comparison to the first voltage. The second voltage can be substantially higher or lower than the first voltage. For example, the second voltage can be X (e.g., 1, 2, 4, 5, etc) orders of magnitude higher or lower than the first voltage. As an example, the first current can comprise an alternating current and the second current can comprise a direct current. As another example, the first current can comprise a first direct current and the second current can comprise a second direct current.

The apparatus 700 preferably comprises a chamber 702. For example, the chamber 702 can be configured as a vacuum chamber. The chamber 702 can comprise a main body 704. In an aspect, the chamber 702 can comprise a top cap 706. The chamber 702 can comprise a bottom cap 708. The top cap 706 and the bottom cap 708 are disposed at opposite ends of the chamber 702. For example, the top cap 706 can be attached to, affixed to, connected to, and/or extend from a top of the main body 704. The bottom cap 708 can be attached to, affixed to, connected to, and/or extend from a bottom of the main body 704. For example, the main body 704 can comprise a first set of flanges 710. The main body 704 can comprise a second set of flanges 712. The first set of flanges 710 and the second set of flanges 712 may extend outward from the main body 704 (e.g., from an exterior wall 714 of the main body 704). The top cap 706 may comprise a third set of flanges 716, and the bottom cap 708 may comprise a fourth set of flanges 718. The first set of flanges 710 and the third set of flanges 716 may be affixed to each other (e.g., as described further herein with reference to FIG. 9). The second set of flanges 712 and the fourth set of flanges 716 can be affixed to each other (e.g., as suggested in FIG. 9).

The chamber 702 preferably features an interior wall 715. For example, the chamber 702 can be configured to contain (e.g., enclose) a substance 720. The substance 720 can comprise a gas, plasma, liquid, and/or the like, and the chamber 702 can be at least partially filled with the substance 720. The substance 720 can be configured to change from one form or state to another. For example, the substance 720 can be configured to change from a gas to a plasma. An as example, the substance 720 can comprise a gas, such as argon, hydrogen, helium, neon, krypton, xenon, nitrogen, oxygen, carbon dioxide, a combination thereof, and/or the like. The substance 720 can be filled into the chamber to a specified pressure (e.g., 5 mtorr) to achieve a desired behavior (e.g., motion) of the substance 720. By way of example, a preferred operating pressure range may be between 0.1 mtorr and 20 mtorr. Other pressure ranges can be used, such as between 0.1 and 5 mtorr, 0.1 and 10 mtorr, 0.1 and 15 mtorr, 5 and 10 mtorr, 5 and 15 mtorr, 5 and 20 mtorr, 10 and 15 mtorr, 10 and 20 mtorr, 15 and 20 mtorr, 0.1 to 25 mtorr, 0.01 to 20 mtorr, and/or any other appropriate range. The apparatus 700 (e.g., chamber 702) preferably is configured such that at pressures under a threshold pressure (e.g., 2 mtorr) the primary voltage can increase and the primary current can decrease as the pressure is decreased. In another aspect of the system and method, the substance 720 can be converted from a gas to a plasma by applying the first current, first voltage, and/or the like to the substance 720 (e.g., via at least two input electrodes 724). For example, the substance 720 can be converted to plasma before, at the time of, or after the first current is conveyed to the chamber 702.

The chamber 702 preferably is configured (e.g., shaped) to cause, direct, constrain, control, and/or the like motion of the substance 720 within the chamber 702. The chamber 702 is typically, but not necessarily, cylindrically shaped. The chamber 702 usually defines or comprises a first axis 722 along the length of the chamber 702. The chamber 702 alternatively can be configured with any other appropriate geometry, such as a cube (e.g. hollow cube), rectangular prism (e.g., hollow rectangular prism), sphere (e.g., hollow sphere), cone (e.g., hollowed cone), pyramid (e.g., hollowed pyramid), hexagonal prism (e.g., hollowed hexagonal prism), a prism of any appropriate number of sides (e.g., hollowed prism), and/or the like. It should be noted that both the pressure of the gas and the shape of the chamber 702 can affect the output of the apparatus 700. Accordingly, a variety of pressures and/or shapes can be developed and used according to general principles in the art to achieve specific outputs.

The apparatus 700 ordinarily comprises at least two input electrodes 724. For example, the at least two input electrodes 724 may comprise a first input electrode 726. The at least two input electrodes 724 can comprise a second input electrode 728. The at least two input electrodes 724 can comprise a third input electrode 730. The at least two input electrodes 724 can be spaced around the chamber 702. For example, the at least two input electrodes 724 can be equally spaced around the chamber 702, as suggested by FIG. 7. In one possible embodiment, at least two input electrodes 724 can be configured to receive a first current (e.g., an alternating current) into the chamber 702. The first current can be a single phase current, a polyphase current, and/or the like. The at least two input electrodes 724 can be configured to carry, deliver, channel, and/or the like a single-phase current (e.g., single phase alternating current) in to the chamber 702. The at least two input electrodes 724 also may be configured to carry, deliver, channel, and/or the like a three-phase current (e.g., three-phase alternating current) in to the chamber 702. For example, the at least two input electrodes 724 can comprise at least two sets of input electrodes, such as at least two sets of alternating current input electrodes, direct current input electrodes, and/or the like. As a further example, the at least two input electrodes 724 can comprise three sets of three input electrodes. For single phase current, the at least two input electrodes 724 (e.g., two input electrodes) can be spaced substantially 180 degrees apart (e.g., around the chamber). For three-phase current, the at least two input electrodes 724 (e.g., three input electrodes) can be spaced substantially 120 degrees apart (e.g., around the chamber).

Figure 9:
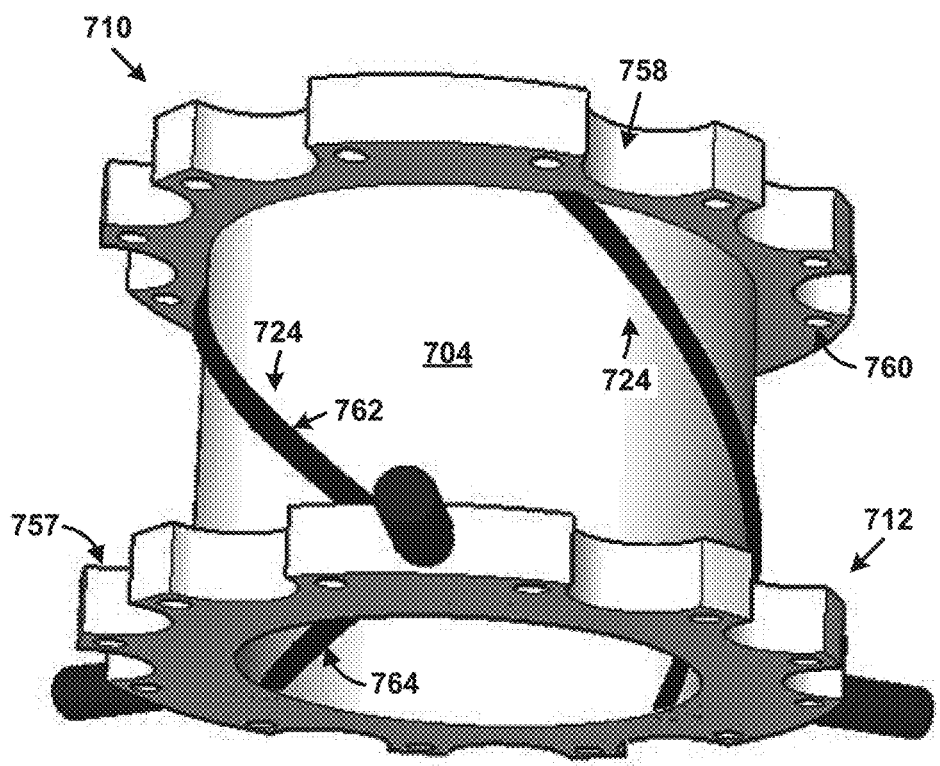
FIG. 9 illustrates a three-dimensional side view showing the main body of the apparatus.

In a possible embodiment according to this disclosure, the at least two input electrodes 724 may also be configured (e.g., disposed, positioned) to direct the first current (e.g., alternating current) to induce motion in the plasma. For example, the at least two input electrodes 724 can be disposed at least partially within the chamber 702. As a further example, one or more of the at least two input electrodes 724 can comprise a helically shaped portion (e.g., helically shaped wire) within the chamber 702. Also, the at least two input electrodes 724 can comprise a first portion 732 extending outside of the chamber 702. The at least two input electrodes 724 can comprise a second portion 734 extending inside the chamber 702. The second portion 734 can be helically shaped. For example, the second portion 734 can be helically wound, have a helical twist, and/or the like. As an illustration, the second portion 734 may have a 10:1 twist (e.g., the second portion 734 travels 10 times as far in the axial direction as they do in the poloidal (azimuthal direction)). Other twists can be used and ratios can be adapted for particular use. For example, twists can range from about 1:50 to about 1:1 axial to poloidal ratio. In an aspect, the magnitude of the second current and/or second voltage can be dependent and/or otherwise related to the amount of twist (e.g., helical twist) of the second portion. As indicated in FIG. 7, the first portion 732 can be disposed perpendicular to the first axis 722 of the chamber 702. The second portion 734 can be disposed at a first angle 736 from the exterior wall 714. The second portion 734 can also be disposed at a second angle 738 representing a tilt from the first axis 722 (e.g. or axis parallel thereto). The second portion 732 can be wrapped along (e.g., around) the interior and/or exterior wall 714 of the chamber 702 (e.g., as shown in FIG. 9). For example, the second portion 732 can comprise a curvature (e.g., twist, helical twist) that substantially matches the curvature of the exterior wall 714 of the chamber 702.

In an aspect of the system and method, the induced motion can comprise a turbulent flow, a laminar flow, or a combination thereof The induced motion can comprise a rotation sheared in an axial direction relative to the plasma. The velocity of the motion can change magnitude and direction along the diameter of the chamber 702. Inducing the motion can include inducing a differential rotation in the plasma. For example, the motion can be along a first direction 740 at the center of the chamber 702. The motion can be along a second direction 742 along interior walls 715 of the chamber 702. The second direction 742 can be opposite the first direction 740. The first direction 740 and the second direction 742 can be directions along (e.g., parallel to) the first axis 722 of the chamber 702.

The apparatus 700 may comprise a solenoid 744 (e.g., or wire). The solenoid 744 can be disposed around at least a portion of the exterior wall 714 of the chamber 702. An electric current passing through the solenoid 744 can induce a first magnetic field within the chamber 702 in an axial direction (e.g., along the first axis 722) of the solenoid 744. The first magnetic field can be caused by the induced motion to align, at least in part, with second magnetic fields caused by the first current directed through the second portions of the at least two input electrodes 724. This alignment can, at least in part, induce (e.g., generate) the second current (e.g. a direct current) within the chamber 702.

Additionally, the induced motion (e.g., and the alignment of the first magnetic field) of the plasma may generate the second current (e.g., direct current) and the second voltage. The magnitude of the second current and/or the second voltage can depend, at least in part, on the first angle 736 and/or the second angle 738. For example, as the second portion 734 becomes more parallel (e.g., decreasing the first angle 736) to the first axis 722, the second voltage can decrease. As the second portion 734 becomes less parallel (e.g., increasing the first angle 736 and/or second angle 738) to the first axis 722, the second voltage can increase. Further, the second portion 734 of the at least two input electrodes 724 can be configured to direct the first current to generate an electric field within the chamber 702. The electric field thus can be generated between at least two of the at least two input electrodes 724. In an aspect, the electric field can be a helically symmetric electric field. For example, the electric field can be rotated along the first axis 722. The electric field can cause, at least in part, the second current and/or the second voltage to be generated within the chamber 702.

The apparatus 700 additionally can comprise at least two output electrodes 746. The at least two output electrodes 746 can extend from the chamber 702. For example, a first output electrode 748 of the at least two output electrodes 746 can be disposed (e.g., at least in part) through the top cap 706. A second output electrode 750 of the at least two output electrodes 746 can be disposed (e.g., at least in part) through the bottom cap 708. The at least two output electrodes 746 can comprise an exterior portion 752 disposed outside the chamber 702. The at least two output electrodes 746 can comprise an interior portion 754 disposed inside the chamber 702. The interior portion 754 can conform to the shape of the corresponding top cap 706 or bottom cap 708. For example, the interior portion 754 can be at least X (e.g., 30, 50, 70, 80, 90) percent as wide as the chamber 702. The interior portion 754 can be X (e.g., 1.5, 2, 3) times wider than the exterior portion 752.

The at least two output electrodes 746 can be configured in a preferred embodiment to conduct the second current (e.g., a direct current) from the chamber 702 based on the induced motion in the substance 720. For example, the induced motion can cause the second voltage and/or the second current to form between the first output electrode 748 and the second output electrode 750.

Continued reference to FIG. 7 shows that apparatus 700 can comprise a protective cover 756 disposed between the solenoid 744 and the chamber 702. The protective cover 756 can at least partially surround the exterior wall 714 of the chamber 702.

It is noted that in some implementations the operation of the apparatus 700 may be reversible. For example, the at least two input electrodes 724 can function as output electrodes. The at least two output electrodes 746 can function as input electrodes. Accordingly, an alternating current can generated based on a direct current (e.g., received by the at least two output electrodes 746). The alternating current can be carried from the apparatus 700 via the at least two input electrodes 724.

Figure 8:
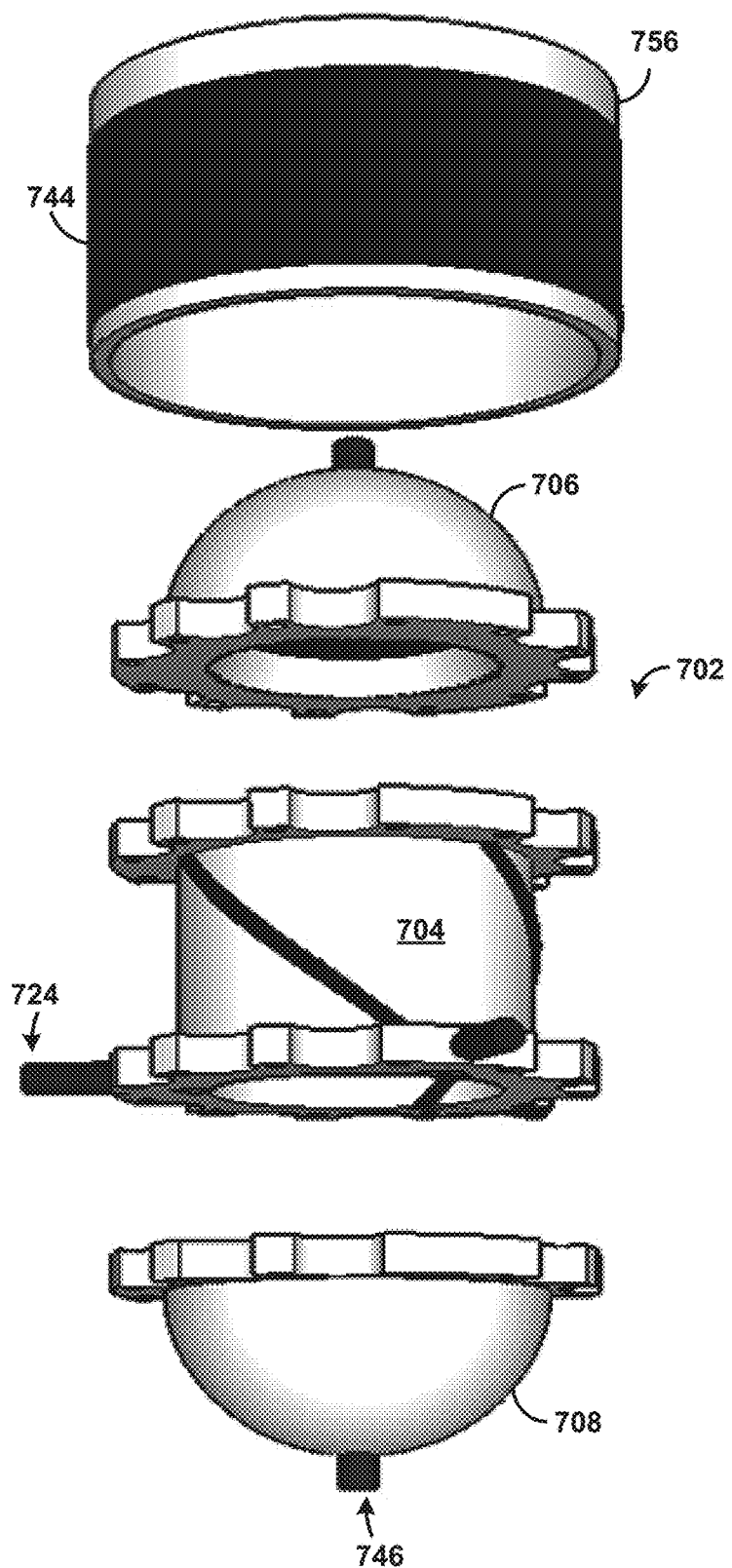
FIG. 8 illustrates a three-dimensional exploded side view of the exterior of apparatus.

FIG. 8 illustrates a three-dimensional exploded side view of the exterior of apparatus 700. For example, the top cap 706 and the bottom cap 708 are shown. The solenoid 744 and protective cover 756 are also shown. The at least two input electrodes 724 and the at least two output electrodes 746 are also illustrated. In an aspect, the at least two input electrodes 724 can be spaced around the circumference of the chamber 702. For example, the at least two input electrodes 724 can comprise three electrodes spaced substantially every 120 degrees around the circumference of the chamber 702.

FIG. 9 illustrates a three-dimensional side view showing the main body 704 of the apparatus 700. The main body 704 is shown with the top cap 706 and the bottom cap 708 removed. The first set of flanges 710 and the second set of flanges 712 are also shown. The first set of flanges 710 and second set of flanges 712 can each comprise a plurality of flanges 757 separated by cooling channels 758. The cooling channels 758 may be configured to channel air along the exterior wall 714 to cool the chamber 702. The first set of flanges 710 and the second set of flanges 712 can comprise a plurality of fastening holes 760. The plurality of fastening holes 760 can allow fasteners (e.g., bolts) to affix the top cap 706 and the bottom cap 708 to the main body 704 (e.g., as shown in FIG. 2). For example, the first set of flanges 710 and the third set of flanges 716 can be affixed to each other by use of the fasteners in corresponding holes of the plurality of fastening holes 760. The second set of flanges 712 and the fourth set of flanges 716 can be affixed to each other by use of the fasteners in corresponding holes of the plurality of fastening holes 760.

The at least two input electrodes 724 are also shown. The at least two input electrodes 724 can be configured for cooling from a cooling source exterior to the chamber 702. In this aspect, the at least two input electrodes 724 may be positioned (e.g., embedded, formed) in the exterior wall 714. Further, the at least two input electrodes 724 can be exposed to both the interior of the chamber 702 and the exterior of the chamber 702. For example, a first side 762 (e.g., portion) of the at least two input electrodes may be exposed to the exterior of the chamber (e.g., main body 704). A second side 764 (e.g., portion) of the at least two input electrodes 724 may be exposed to the interior of the chamber (e.g., main body 704). The first side 762 can receive a cooling substance (e.g., air, gas, liquid) as the cooling substance passes across the exterior wall 714. The first side 762 can receive the cooling substance after it passes through the cooling channels 758. In another aspect, the at least two input electrodes 724 can be configured for cooling within the chamber 702. For example, the at least two input electrodes 724 can be cooled by the cooling substance within the chamber 702.

Figure 10:
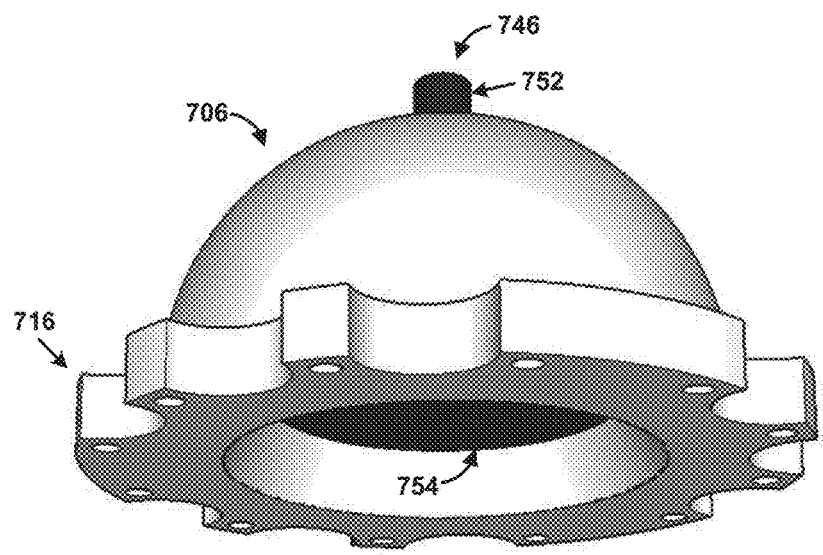
FIG. 10 is a diagram illustrating an example top cap of the example apparatus.

FIG. 10 diagrams an exemplary top cap 706 of the example apparatus 700. A third set of flanges 716 are shown. As previously described, the interior portion 754 of the at least two output electrodes 746 can conform to the interior of the top dome and be substantially larger that the exterior portion 752 of the at least two output electrodes 746.

Figure 11:
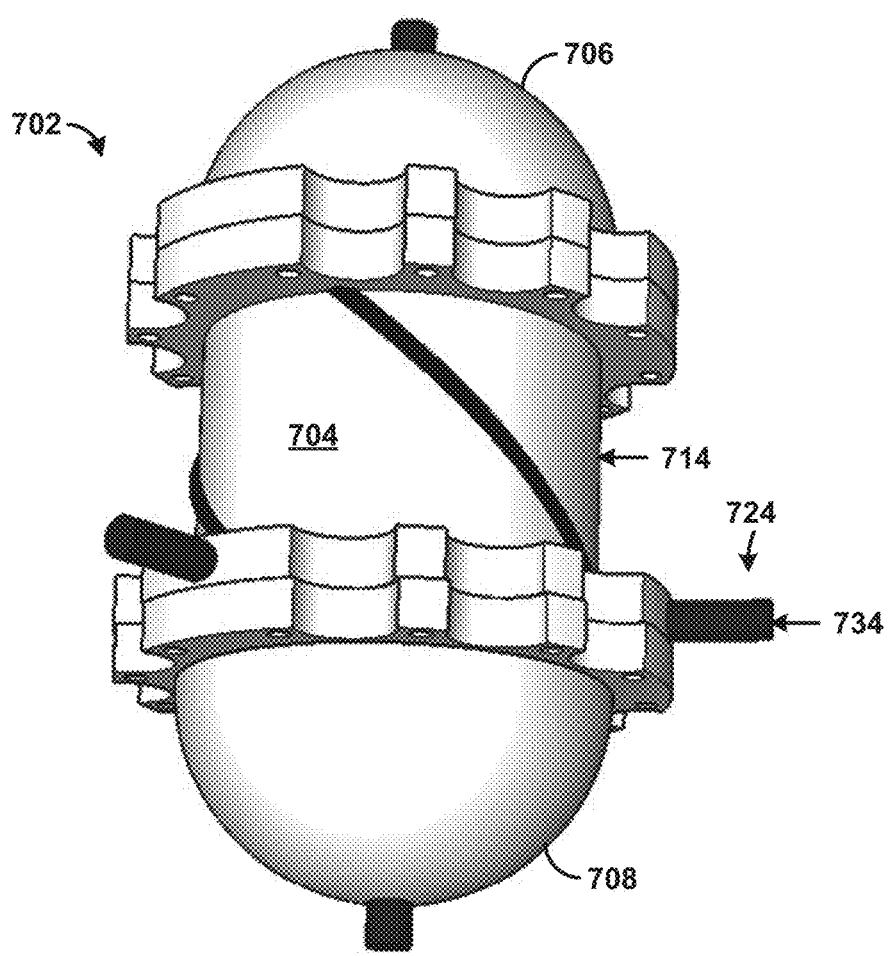
FIG. 11 is a diagram illustrating a view of the example apparatus without a protective cover.

FIG. 11 is a diagram illustrating a view of the example apparatus 700 without a protective cover 756 in place. The top cap 706 and the bottom cap 708 are shown affixed to the main body 704. The exterior wall 714 of the chamber 702 also is seen in FIG. 11. The second portion 734 of the at least two input electrodes 724 are disposed through and/or protruding (e.g., extending) from one or more of the second set of flanges 712. In some alternative configurations, the second portion 734 of the at least two input electrodes 724 can be disposed through and/or protruding from the exterior wall 714 (e.g., as shown in FIG. 8).

Figure 12:
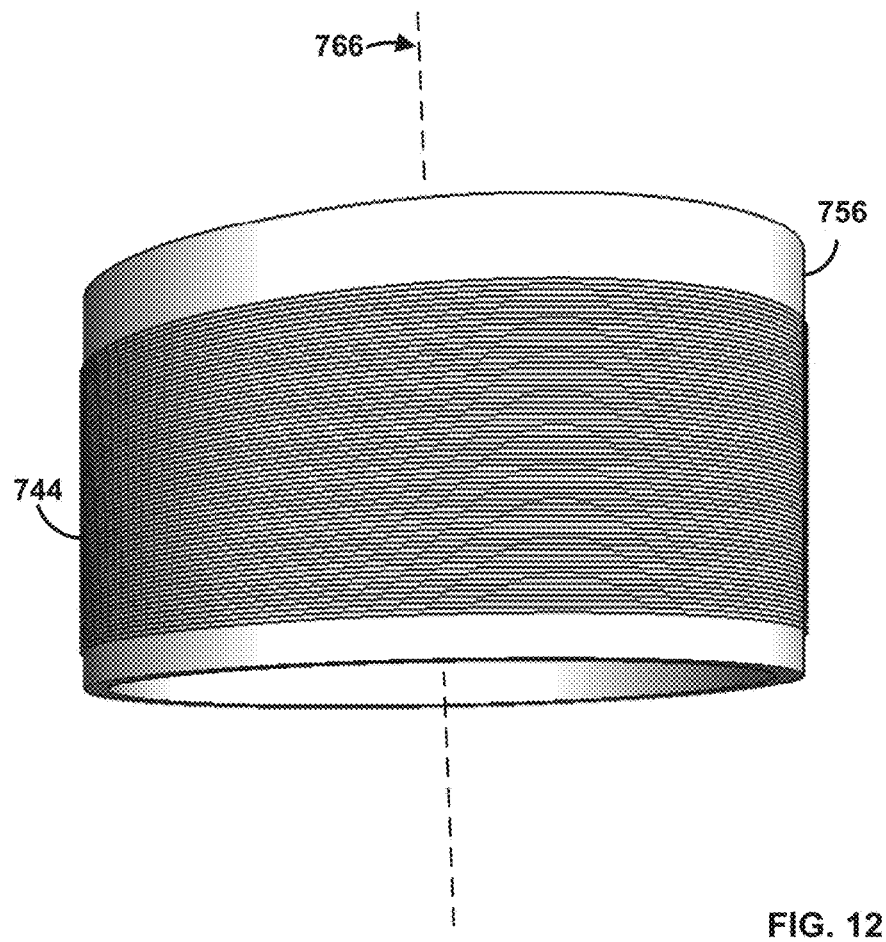
FIG. 12 is a diagram illustrating a view of the protective cover of the example apparatus.

FIG. 12 illustrates a version of the protective cover 756 of the example apparatus 700. The solenoid 744 can be wrapped around the protective cover 756. The protective cover 756 can comprise a non-conductive material, such as a ceramic material. In an embodiment of the system, the protective cover 756 can be configured to wind the solenoid 744 (e.g., around the chamber 702, main body 704). The protective cover 756 can be configured to position the solenoid 744. For example, the protective cover 756 can be configured to keep the solenoid 744 centered in place around the chamber 702 (e.g., main body 704), position the solenoid at an optimal (e.g., specific, ideal, desired) distance from the chamber 702 (e.g., or main body 704) for generating an optimal magnetic field (e.g., first magnetic field), and/or the like. The protective cover 756 can be configured to protect the solenoid 744 from heat generated by at least a portion of the at least two input electrodes 724.

It here is noted that the use of the protective cover 756 and the solenoid 744 is one of a variety of ways in which the apparatus 700 may be configured. An appropriate magnetic field (e.g., first magnetic field) can be provided into the chamber 702 in other ways. For example, the apparatus 700 can comprise magnets (e.g., permanent magnets) centered on the apparatus 700 (e.g., main body 704), or any other feature or components configured for creating an appropriate magnetic field. In some alternative embodiments, the protective cover 756 may be omitted.

The solenoid 744 preferably comprises a wire composed of a conductive material. The solenoid 744 can be configured to generate a magnetic field along a longitudinal axis 766 of the solenoid 744. For example, the wire can be configured to receive electrical current and/or voltage from an electrical source. The wire can be electrically coupled to the electrical source. In an aspect, the wire can be coil shaped. For example, the wire can be wrapped, coiled, wound (e.g., around the protective cover) and/or the like. The strength of the magnetic field can be related to the number of turns (e.g., number of loops) of the coil (e.g., around the protective cover). Thus, the wire can be configured with an appropriate number of turns to achieve a specific output from the apparatus 700.

Figure 13:
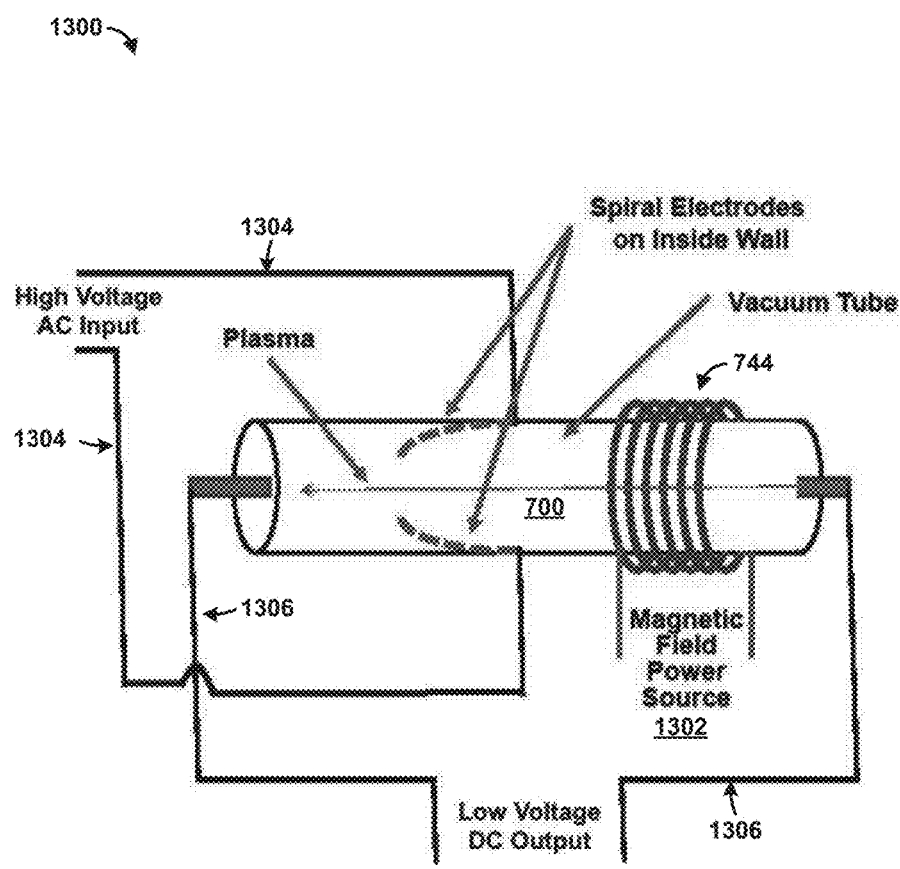
FIG. 13 is a circuit diagram illustrating an example system for transforming electrical current.

FIG. 13 is a circuit diagram illustrating an example system for transforming electrical current. In an aspect, the system 1300 can comprise the apparatus 700 (e.g., AC-DC transformer) described herein. For example, the apparatus 700 can comprise a transformer configured to transform an alternating current to a direct current. The system 1300 can comprise a magnetic field power source 1302. The magnetic field source can comprise a current source, voltage source, and/or the like configured to provide current and/or voltage to the solenoid 744 (e.g., thereby generating a magnetic field along the axis of the solenoid 744). The current and/or voltage are selectable to cause a target current and/or target voltage to be induced from the apparatus 700. The system 1300 preferably includes input lines 1304. Input lines 1304 are electrically conductive paths. The input lines 1304 can be configured to carry an alternating current to the apparatus 700. For example, the input lines 1304 can be electrically coupled to the at least two input electrodes 724 of the apparatus 700. The system 1300 preferably also comprises output lines 1306. The output lines 1306 are electrically conductive paths. The output lines 1306 can be configured to carry a direct current from the apparatus 700. For example, the output lines 1306 can be electrically coupled to the at least two output electrodes 746. In an aspect, the output lines 1306 can be electrically coupled to an electrical delivery network configured to conduct the direct current to at least one remote location (e.g. a remote component of a device, a remote device in a system, a remote power station). The voltage carried by the input lines 1304 can be a higher voltage in comparison to the voltage carried by the output lines 1306.

The system 1300 can be integrated into and/or implemented in a variety of devices, systems, and/or applications, such as a data center (e.g., 480 VAC to 380 VDC), commercial buildings and micro grids, fast DC vehicle charging, electric trains, ultra capacitors for electric bus charging through inductive charging systems, DC electric steel making systems, aluminum refining systems, converting AC to DC for large earthmoving or military vehicles, converting AC to DC for large aircraft, converting AC to DC for wind power generation, converting AC to DC for high voltage direct current transmission, and the like.

Figure 14:
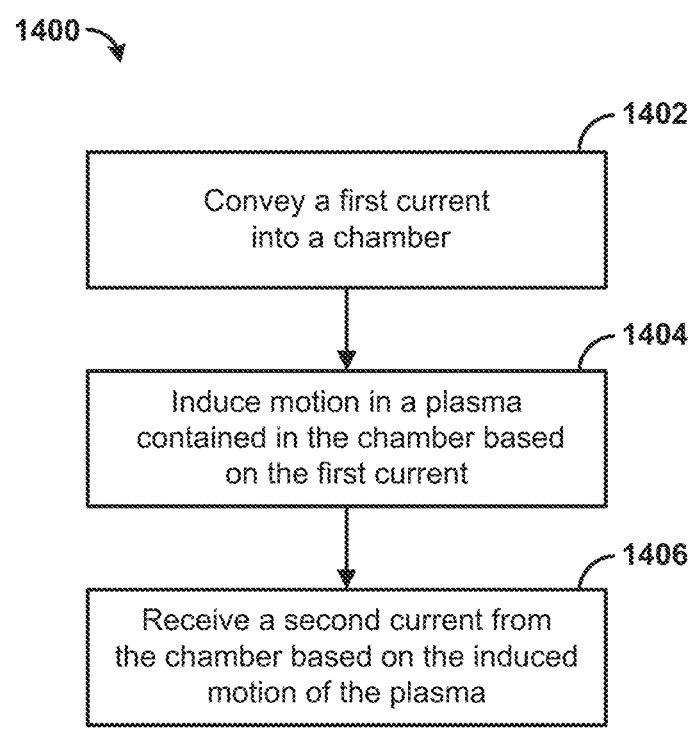
FIG. 14 is a flow chart illustrating an example method for transforming an electrical current.

Attention is advanced to FIG. 14, providing a flow chart illustrating an example method 1400 for transforming and/or converting a voltage and/or an electrical current. At step 1402, a first current can be conveyed (e.g., provided, carried, transported, channeled) into a chamber. The first current can comprise an alternating current, a direct current, and/or the like. The first current can comprise a first voltage. For example, the first current can be conveyed to the chamber from a component of a power plant, power station, power line, and/or the like. The first current can be conveyed into the chamber via one or more electrodes (e.g., two, three, six, nine). The one or more electrodes can be disposed at least partially within the chamber. For example, the one or more electrodes can each comprise a first portion extending outside of the chamber and a second portion within the chamber.

The chamber may contain a gas, plasma, and/or the like. For example, the chamber can be filled with a gas, such as argon. The gas can be converted to plasma before, at the time of, or after the first current is conveyed to the chamber. The plasma and/or gas can be filled to a specified pressure (e.g., 5 mtorr) to achieve a desired behavior (e.g., motion) of the plasma and/or gas. The chamber can be configured (e.g., shaped) to cause, direct, constrain, control, and/or the like motion of the plasma within the chamber. For example, the chamber can be cylindrically shaped.

According to the system and method, a magnetic field can be generated through the plasma. For example, a wire proximate the chamber can generate a magnetic field. The wire, which may define a solenoid, can be disposed (e.g., wrapped) around an exterior wall of the chamber. In an aspect, a protective layer (e.g., cover, shroud) can be disposed in between the wire and the chamber.

At step 1404 of FIG. 14, motion can be induced in a plasma contained within the chamber based on the first current. For example, the first current can generate a second magnetic field within the chamber. The second magnetic field can be based on the path of the first current. For example, the one or more electrodes can be disposed, shaped, or the like, to generate an electric field between at least two of the one or more electrodes. In an aspect, the electric field can be a helically symmetric electric field. For example, the electric field can be rotated along the axis of the chamber. The electric field can cause, at least in part, the second current and/or the second voltage to be generated within the chamber.

Inducing the motion in the plasma can distort the magnetic field thereby inducing a second current within the chamber. Inducing motion in the plasma can comprise providing the first current through at least one helical electrode within the chamber. The induced motion can comprise rotation sheared in an axial direction relative to the plasma. Induced motion can comprise a differential rotation in the plasma. The induced motion may comprise a turbulent flow, a laminar flow, or a combination thereof For example, the motion can be along a first direction at the center of the chamber. The motion can be along a second direction along interior walls of the chamber. The second direction can be opposite the first direction. The first direction and the second direction can be directions along (e.g., parallel to) the axis of the chamber.

At step 1406, the second current can be received from the chamber based on the induced motion of the plasma. The second current can comprise a direct current, alternating current, and/or the like. As an illustration, the first current can comprise an alternating current and the second current can comprise a direct current. The first current can comprise a direct current and the second current can comprise an alternating current.

The second current can be generated in an axial direction (e.g., along an axis or length of the chamber). For example, the second current can be generated along a line extending from a top (e.g., top cap) of the chamber to a bottom (e.g., bottom cap) of the chamber.

Furthermore, the first current can be conveyed with a first voltage. The second current can be conveyed with a second voltage. The second voltage can be a high voltage or low voltage in comparison to the first voltage. For example, the second voltage can be X (e.g., 1 2, 3, 4, 5, etc.) orders of magnitude greater or less than the first voltage.

The following examples are now offered so as to provide those of ordinary skill in the art with a further disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This is true for any possible non-express basis for interpretation, including: matters of logic with respect to arrangement of steps or operational flow; plain meaning derived from grammatical organization or punctuation; the number or type of embodiments described in the specification.

Various publications are referenced hereinabove. The disclosures of these publications in their entireties are hereby incorporated by reference into this application in order to more characterize the state of the art to which the methods and systems pertain.

It will be apparent to those skilled in the art that various modifications and variations can be made without departing from the scope or spirit of the disclosed invention. Other embodiments will be apparent to those skilled in the art from consideration of the specification and practice disclosed herein. It is intended that the specification and examples be considered as exemplary only, with the scope of the invention being defined by the claims appended hereto.

What is claimed is:

1. An apparatus comprising:
   a chamber configured to contain plasma;
   at least two input electrodes disposed at least partially within the chamber and configured to receive an alternating current into the chamber, wherein the at least two input electrodes are configured to direct the alternating current to induce motion in the plasma; and
   at least two output electrodes extending from the chamber, wherein the at least two output electrodes are configured to conduct a direct current from the chamber based on the induced motion in the plasma.

2. The apparatus of claim 1, wherein the at least two input electrodes are equally spaced around the chamber.

3. The apparatus of claim 1, wherein the chamber comprises atop cap and a bottom cap at opposite ends of the chamber, and wherein a first output electrode of the at least two output electrodes is disposed through the top cap, and a second output electrode of the at least two output electrodes is disposed through the bottom cap.

4. The apparatus of claim 1, further comprising a solenoid disposed around at least a portion of an external wall of the chamber, wherein an electric current passing through the solenoid induces a magnetic field within the chamber in an axial direction of the solenoid.

5. The apparatus of claim 4, wherein the magnetic field is caused by the induced motion to align at least in part with magnetic fields caused by at least a portion of the at least two input electrodes thereby inducing the direct current within the chamber.

6. The apparatus of claim 4, further comprising a protective cover disposed between the solenoid and the chamber.

7. The apparatus of claim 1, wherein the at least two input electrodes comprise at least two sets of alternating current input electrodes.

8. A method comprising:
   conveying an alternating current into a chamber;
   inducing motion in a plasma contained in the chamber based on the alternating current; and
   receiving a direct current from the chamber based on the induced motion of the plasma.

9. The method of claim 8, further comprising generating a magnetic field through the plasma, and wherein inducing the motion in the plasma distorts the magnetic field thereby inducing the direct current within the chamber.

10. The method of claim 8, wherein inducing motion in the plasma comprises providing the alternating current through at least one helical electrode within the chamber.

11. The method of claim 8, wherein inducing motion comprises inducing a rotation sheared in an axial direction relative to the plasma, and wherein the direct current is generated in the axial direction.

12. The method of claim 8, wherein conveying an alternating current comprises conveying with a first voltage, and further comprising conveying the direct current with a second voltage, wherein the second voltage exceeds the first voltage.

13. The method of claim 8, wherein the inducing motion comprises generating a turbulent flow, a laminar flow, or a combination thereof.

14. The method of claim 8, wherein inducing motion comprises inducing a differential rotation in the plasma.

15. A system comprising a transformer configured to transform an alternating current to a direct current, the transformer comprising,
   a chamber configured to contain plasma;
   at least two input electrodes disposed at least partially within the chamber and configured to direct the alternating current to induce motion in the plasma, thereby generating the direct current;
   at least two output electrodes extending from the chamber and configured to conduct the direct current from the chamber; and
   an electrical delivery network electrically coupled to the at least two output electrodes and configured to conduct the direct current to at least one remote location.

16. The system of claim 15, wherein the at least two input electrodes comprise at least one helically shaped portion.

17. The system of claim 15, wherein the chamber comprises a top cap and a bottom cap at opposite ends of the chamber, and wherein a first output electrode of the at least two output electrodes is disposed through the top cap, and a second output electrode of the at least two output electrodes is disposed through the bottom cap.

18. The system of claim 15, wherein the at least two input electrodes comprise at least two sets of electrodes, and wherein each of the at least two sets of electrodes comprise three electrodes equally spaced around the chamber.

19. The system of claim 15, wherein the transformer further comprises a solenoid disposed around at least a portion of an external wall of the chamber, and wherein an electric current passing through the solenoid induces a magnetic field within the chamber in an axial direction of the solenoid.

20. The system of claim 19, wherein the induced the motion in the plasma distorts the magnetic field thereby inducing the direct current within the chamber.

* * * * *